(12) United States Patent
Corbett et al.

(10) Patent No.: US 8,723,390 B2
(45) Date of Patent: May 13, 2014

(54) FLUX COMPRESSION GENERATOR

(75) Inventors: Blaise L. Corbett, King George, VA (US); Jack L. Price, Derwood, MD (US); Albert J. Corda, Dahlgren, VA (US); Yehoshua D. Agassi, Silver Spring, MD (US); Walter D. Sessions, King George, VA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 854 days.

(21) Appl. No.: 12/927,318

(22) Filed: Nov. 10, 2010

(65) Prior Publication Data

US 2012/0313452 A1 Dec. 13, 2012

(51) Int. Cl.
*H02K 1/12* (2006.01)
(52) U.S. Cl.
USPC .......................................... 310/254.1; 310/23
(58) Field of Classification Search
USPC ................................ 310/254.1, 23, 30, 34, 14
See application file for complete search history.

(56) References Cited

U.S. PATENT DOCUMENTS

| 4,293,794 | A | | 10/1981 | Kaspetankos | 315/111.81 |
|---|---|---|---|---|---|
| 4,376,901 | A | | 3/1983 | Pettibone et al. | 310/10 |
| 4,753,153 | A | | 6/1988 | Jasper, Jr. | 89/8 |
| 4,935,708 | A | * | 6/1990 | Weldon et al. | 322/62 |
| 5,059,839 | A | | 10/1991 | Rose et al. | 310/10 |
| 5,125,104 | A | * | 6/1992 | Ohkawa | 455/98 |
| 5,221,892 | A | | 6/1993 | Sullivan et al. | 323/362 |
| 5,835,545 | A | | 11/1998 | Turchi | 376/145 |
| 6,809,434 | B1 | * | 10/2004 | Duncan et al. | 310/12.19 |
| 6,843,178 | B2 | * | 1/2005 | Wood et al. | 102/275.5 |
| 6,870,498 | B1 | * | 3/2005 | Morgan et al. | 342/14 |

OTHER PUBLICATIONS

M. Abrams: "Dawn of the E-Bomb", *IEEE Spectrum*, Nov. 2003, pp. 24-30. http://www.ece.unm.edu/faculty/edl/EdlPDF/SpectrumArticle.pdf.
C. M. Fowler et al.: "Magnetic Flux Compression Generators: A Tutorial and Survey", *Electromagnetic Phenomena*, 3, 3, 305-357, 2003. http://www.emph.com.ua/11/pdf/fowler.pdf.

(Continued)

*Primary Examiner* — Thanh Lam
(74) *Attorney, Agent, or Firm* — Gerhard W. Thielman, Esq.

(57) ABSTRACT

A flux compression generator (FCG) is provided for producing an electromagnetic pulse (EMP). The FCG includes an environmental case, a reactive load, a dielectric core, a superconducting stator, an electric energy source, a load switch, and a transition device. The reactive load transmits the EMP in response to an electric current pulse. The dielectric core has proximal and distal ends within the case, with the stator disposed coaxially around the core that provides structural support. The case contains the electrical energy source, the stator, the core and the transition device. The energy source connects to the stator at the proximal end and powers the transition device. The load switch connects the reactive load to the stator at the distal end. The energy source initially provides an electric current to the stator. The device upon activation heats at least a portion of the stator to reversibly transition the portion from a superconducting state to a non-superconducting state. The stator transfers the electric current as the pulse to the reactive load upon the portion's transition to the non-superconducting state. The stator can be a superconducting helical coil that wraps around the core connected to a superconducting conductor disposed coaxially within the core. Alternatively, the stator can be a stack of superconducting rings disposed coaxially along the core. The superconducting coil and rings can preferably be composed of a high temperature superconductive material on a metal substrate.

24 Claims, 3 Drawing Sheets

(56) References Cited

OTHER PUBLICATIONS

T. Harris: "How E-Bombs Work". http://science.howstuffworks.com/e-bomb.htm/printable.

C. M. Fowler et al., "An Introduction to Explosive Magnetic Flux Compression Generators", LA-9890-MS, Mar. 1975, http://www.ecoversity.org/archives/Magnetic_Flux_Compression_Generators.pdf.

NAVSEA OP 3565 / NAVAIR 16-1-529 v. 2, 16/e Technical Manual, "Electromagnetic Radiation Hazards", Jun. 2007, ch. 2, http://www.everyspec.com/USN/NAVSEA_OP_3565-NAVAIR_16-1-529_VOLUME-2.8137.pdf.

\* cited by examiner

FLUX COMPRESSION GENERATOR

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to flux compression generators. In particular, the invention incorporates high temperature superconductive materials to generate an electromagnetic pulse.

Electronic equipment, such as found in a hostile weapon system, can potentially be disabled by a flux compression generator (FCG) by means of an electromagnetic pulse (EMP). Such an FCG-equipped device has military tactical and strategic value depending on how the FCG is incorporated in a design, and the size and numbers of FCGs incorporated in the device. This effect can interrupt or damage sensitive electronics susceptible to strong electromagnetic fields, such as seeker or targeting systems on an approaching weapon. "Dawn of the E-Bomb" by M. Abrams, *IEEE Spectrum*, November 2003, at http://www.ece.unm.edu/faculty/edl/EdlPDF/SpectrumArticle.pdf, provides a general introduction to such uses.

Conventional FCG devices include the explosive flux compression generator (E-FCG). Further information on the E-FCG is available in "Magnetic Flux Compression Generators: A Tutorial and Survey" by C. M. Fowler and L. L. Altgilbers, *Electromagnetic Phenomena*, v. 3, no. 3, 2003, pp. 305-357, available at http://www.emph.com.ua/11/pdf/fowler.pdf. A briefer summary can be obtained from "How E-Bombs Work" by T. Harris at http://science.howstuffworks.com/e-bomb.htm/printable, with a link to an accompanying video demonstration at http://videos.howstuffworks.com/discovery/7102-electromagnetic-pulse-bomb-video.htm.

Conventional techniques for generating a high-power EMP fall into one of two categories: nuclear generated EMP produced via the Compton effect, and explosive generated EMP usually in the form of a magnetic flux compression generator. Nuclear EMP devices are large devices more strategic than tactical. Low-altitude nuclear EMP generation can cause significant environmental damages from radiation, pressure wave generation, or materials with high kinetic and thermal energy content. High-altitude EMP (HEMP) generation produces damage to ground-based equipment through the generation of an electrical pulse, but can also cause significant damage to orbiting satellite systems through radiation and high energy detritus.

An E-FCG, can be implemented as an EMP generator to cause damage to air- and ground-based electronic systems. The primary damage occurs through the delivery of a focused electrical pulse or energy with ancillary damage resulting from a high pressure wave and high energy detritus from the casing. The pressure wave and high energy detritus associated with a conventional E-FCG can result in unintended and unavoidable collateral damage. Conventional E-FCGs can be difficult to control during initiation due to timing between the energizing system, the explosive initiator, and the switching components, and can therefore be extremely inefficient. To be effective, they must generally be large because of the basic design of these devices. Their large size also affects the logistics of transportation and delivery.

SUMMARY

Conventional explosively driven flux compression generators yield disadvantages addressed by various exemplary embodiments of the present invention. In particular, conventional such generators employ chemical explosives that present safety hazards and preclude non-destructive testing. Various exemplary embodiments provide solutions to these limitations.

Various exemplary embodiments provide a flux compression generator (FCG) for producing an electromagnetic pulse (EMP). The FCG includes an environmental case, a reactive load, a dielectric core with a nominally conductive spline, a superconducting stator, an electric energy source, a load switch, and a transition device.

In various exemplary embodiments, the reactive load transmits the EMP in response to an electric current pulse. The dielectric core has proximal and distal ends within the case, with the stator disposed coaxially around the conductive outer layer of the core that provides structural support. The case contains the electrical energy source, the stator, the core and the transition device. The conductive spline provides a shorting path for the stator current as the superconductive material transitions to a non-superconducting state.

In various exemplary embodiments, the energy source connects to the stator at the proximal end and powers the transition device used to drive the superconductive material out of the super-conducting state. The load switch connects the reactive load to the stator at the distal end. The energy source initially provides an electric current to the stator. The transition device upon activation heats at least a portion of the stator to reversibly transition the portion from a superconducting state to a non-superconducting state. The conductive spline creates an electrically short path for the current maintaining conservation of flux and therefore flux compression. The stator transfers the increasing electric current as a pulse to the reactive load in response to transition of the portion to the non-superconducting state and closing the load switch.

In various exemplary embodiments, the stator can be a superconducting helical coil that wraps around the core connected to a superconducting conductor disposed coaxially within the core. In alternative exemplary embodiments, the stator can be a stack of superconducting rings disposed coaxially along the core.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which.

DETAILED DESCRIPTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

In various exemplary embodiments, the exemplary FCG designs can operate as a primary component of to generate a tactical non-nuclear non-explosive EMP. An EMP device with the above functional description comprises three basic components: an FCG, an impedance balancing network (also referred to as a pulse-forming network), and an output load that can be an antenna or another FCG. Because of the design characteristics of the proposed FCG, the output produces a high voltage pulse that can be tunable both for power output and frequency content. These qualities render the device suitable for a wide variety of applications where highly variable pulse voltage outputs are required.

The disclosure describes an exemplary implementation of an FCG. The impedance balancing network and antenna load are not to be described herein, as the theory and practice of these devices are well known to those knowledgeable in the art. The proposed concept does not significantly affect the design theory regarding electrical load topology.

The envisioned purpose of various exemplary embodiments is to provide a primary component of a tactical non-nuclear non-explosive electromagnetic pulse (EMP) generator device the purposed function of which is the upset or damage of sensitive electronics susceptible to strong electromagnetic fields in a variety of environments including air, space, land and underwater. An EMP is characterized as a broad band signal with a frequency-power distribution typically ranging from a few hundred kilohertz (kHz) to a few gigahertz (GHz). The single effect of an FCG of the proposed design is the generation of a high voltage pulse output that can be incorporated in an EMP generator for the purpose of upsetting or destroying sensitive electronics within a tactical area.

Figure 1:
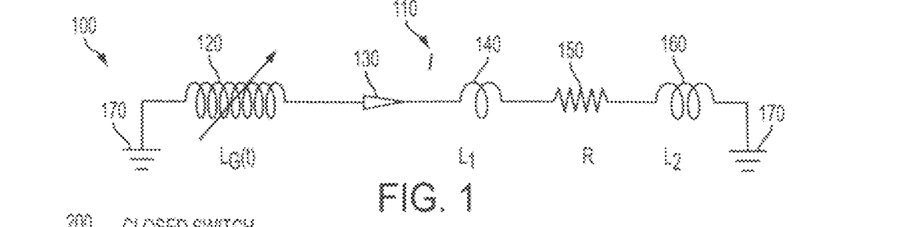
FIG. 1 is an electrical schematic view of a linear FCG circuit.

Elementary generator theory is presented by an introduction to explosive magnetic FCGs. The elementary components of an idealized FCG can be represented, as shown in FIG. 1, as a linear circuit composed of three inductor elements in series with a resistor. In particular, FIG. 1 shows a schematic view 100 of the linear circuit. A transient variable inductor $L_G(t)$ 120 carries current I in a direction 130 towards electrical lead inductance $L_1$ shown by winding 140, a resistor R shown by resistance 150, and a load inductance $L_2$ as winding 160. The circuit is bound at opposite ends by grounds 170.

The inductance of a typical helical winding is proportional to the product of the square of the number of turns and the loop area, and is inversely proportional to the length over the number of turns. The general formula in Le Système International d'unités (meter-kilogram-second or SI) units can be shown in eqns. (1) and (2) as shown:

$$L = \frac{3.95(N^2 + R^2)}{\lambda + 0.9R}, \tag{1}$$

where L is generator inductance, N is the number of winding turns, R is the winding radius, and $\lambda$ is the axial length of the winding. Also, $$E_0 = 0.5(I_0)^2(L_0 + L_1 + L_2), \tag{2}$$

where $E_0$ is initial energy, $I_0$ is initial current, $L_0$ is initial winding inductance, $L_1$ is the electrical lead inductance, and $L_2$ is the load inductance.

The maximum current and maximum drive voltage into the load inductance $L_2$ when the stator winding is discharged at the burnout time $\tau$ can be determined using eqns. (3), (4) and (5) as follows:

$$I(\tau) = I_0 \left[\frac{L_0 + L_1 + L_2}{L_1 + L_2}\right]^{1 - \frac{R_0 \tau}{L_0}}, \tag{3}$$

$$E(\tau) = E_0 \left(\frac{L_2}{L_1 + L_2}\right)\left[\frac{L_0 + L_1 + L_2}{L_1 + L_2}\right]^{1 - \frac{2R_0 \tau}{L_0}}, \tag{4}$$

$$V(\tau) = \frac{I(\tau)L_0}{\tau}, \tag{5}$$

where $I(\tau)$ is burnout current, $R_0$ is circuit resistance, $E(\tau)$ is burnout energy, and $V(\tau)$ is drive voltage.

The following quantities can be assumed for explanatory and exemplary purposes for an ideal system, where $\Omega$ is ohms, H is henrys, A is amperes, V is volts, J is joules: initial current $I_0$=0.1 A, resistance $R_0$=10 m$\Omega$, lead inductance $L_1$=2 nH, and load inductance $L_2$=10 nH. For an inductor axial length of $\lambda$=2.54 cm (1 in), inductor radius R=2.54 cm (1 in), number of winding turns N=100, winding burnout time $\tau$=100 nanoseconds, then initial winding inductance $L_0$=528.054 µH, burnout current $I(\tau)$=4400 A, drive voltage $V(\tau)$=23.0×10$^6$ V (or 23.0 MV), $E(\tau)$=96.8×10$^{-3}$ J (or 96.8 mJ).

Although the model is idealized and therefore optimal in calculated output yields, the maximum induced voltage to the load can be very high in large part to the fast transition time, even with a relatively small current. The efficiency of transferring the high voltage energy depends on the impedance match between the FCG and the load. The load being reactive in nature and therefore needs to be carefully designed to match the impedance of the FCG.

Figure 2:
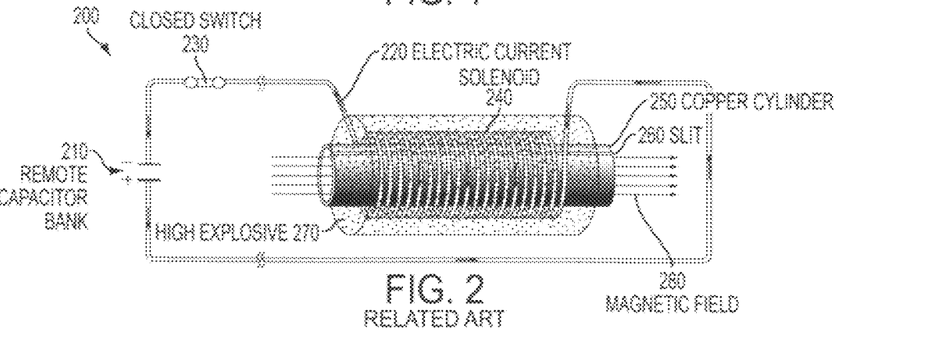
FIG. 2 is an isometric view of a conventional E-FCG prior to operation.

FIG. 2 shows an isometric schematic view 200 of a conventional configuration E-FCG circuit prior to activation. A remote capacitor charge bank 210 provides a reservoir of electrical charge to carry an electric current 220 through the circuit. A switch 230 closes to supply the current through a helical solenoid 240 wound about an annular copper cylinder 250 having a slit 260. Within its core, the cylinder 250 contains a high explosive 270, depicted after explosive expansion. The current 220 through the solenoid 240 produces a magnetic field 280 depicted along the axis of the cylinder 250 and looping back radially beyond the solenoid 240.

Figure 3:
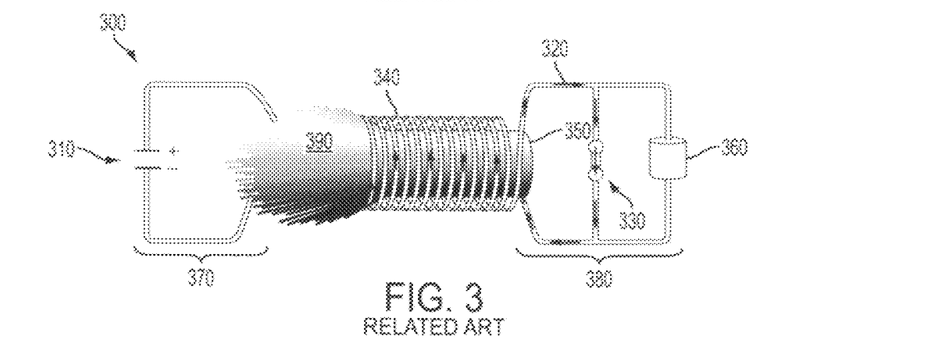
FIG. 3 is an isometric view of the conventional E-FCG shortly after initiation.

FIG. 3 shows an isometric schematic view 300 of the conventional configuration E-FCG circuit at an early time after detonation. The charge bank 310 discharges to transmit current 320 through the circuit that includes a closed switch 330, a shortened solenoid 340 that wraps around a shortened cylinder 350, and an uncharged capacitor 360. The charge bank 310 is disposed on the initiation portion 370 of the solenoid 340, and the switch 330 and the capacitor 360 are disposed in parallel on the charging portion 380 of the solenoid 340. The initiation portion 370 of the circuit initiates the explosive 270 to produce an explosive rupture 390 of the cylinder 350 and the solenoid 340. Consequently, the cylinder 350 expands to produce a short circuit within the parallel portion 380 of the circuit, bypassing the capacitor 360 with the switch 330 being closed.

Figure 4:
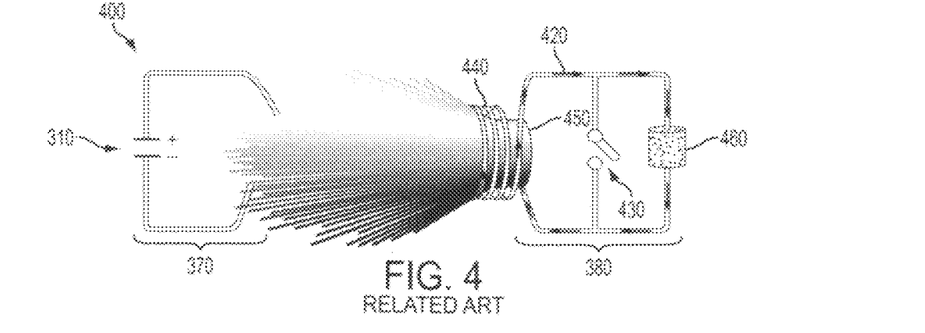
FIG. 4 is an isometric view of the conventional E-FCG transferring energy to produce the EMP.

FIG. 4 shows an isometric schematic view 400 of the conventional configuration E-FCG circuit at a late time after detonation showing an open switch 430. The current 420 passes though the parallel portion 380 beyond the shortened solenoid 440 and the copper cylinder 450 and includes the switch 430 and capacitor 460. The cylinder 450 reaches maximum expansion, such that the magnetic field intensifies as the solenoid 440 shortens. When the impedance of the solenoid 440 has diminished to the same level as the capacitor 460, the switch 430 opens to divert the current 420 that then charges the capacitor 460.

Various exemplary embodiments provide implementation of a magnetic flux compression generator (FCG) using a high temperature superconductive material (HTSCM). The device employs advances made in HTSCMs which typically are based on a family of cuprates but may include other novel materials without departing from the scope of the invention. Two exemplary HTSCMs include mercury-thallium-barium-calcium-copper-oxide or tin-lead-indium-barium-thorium-copper-oxide. The components themselves are formed on a base material such as nickel, because of the unique granular alignment characteristics of the nickel.

The implementation of various exemplary embodiments include composition of an environmentally sealed casing, a conductive stator in the form of a helical winding or a ring stack made of an appropriate HTSCM surrounding a non-conductive core, an energizing system and a transition mechanism for establishing the temperature environment for the HTSCM between superconducting and non-superconducting states.

In large platforms, electrically initiated explosive devices can be very sensitive to radio emissions or fire. Therefore, storage and handling become major issues, especially on ships or aircraft. An E-FCG has seven major components: an energizing system comprising a capacitor bank 210, an expanding armature having a switch 230 (or fuse) that conducts electric current 220, a solenoid 240, and an explosive case 270, as shown in FIG. 2. An initial energy in the form of a current pulse is produced by the energizing system (e.g., the bank 310) to the stator coil (e.g., the solenoid 340). After a short period of time, the energizing system is disconnected via a switch or fuse, and the explosive case 270 of the armature is detonated as shown in view 300 of FIG. 3.

The detonation leads to a progressive expansion of the armature (e.g., the truncated cylinder 350) into the truncated solenoid 340 as a stator coil with the effect of shorting the windings in the solenoid 340. This progressive shorting compresses the magnetic flux field until flux can no longer be sustained within the system, as shown in view 400 of FIG. 4, and the energy is launched into a following load, such as the capacitor 460. The load forms a pulse forming network, launching antenna energy as an electromagnetic wave. The explosive case 270 presents a safety hazard, and operational testing of the conventional FCG requires physical destruction of the solenoid 240 and its supporting cylinder 250, thereby precluding further operation of unit.

Figure 5:
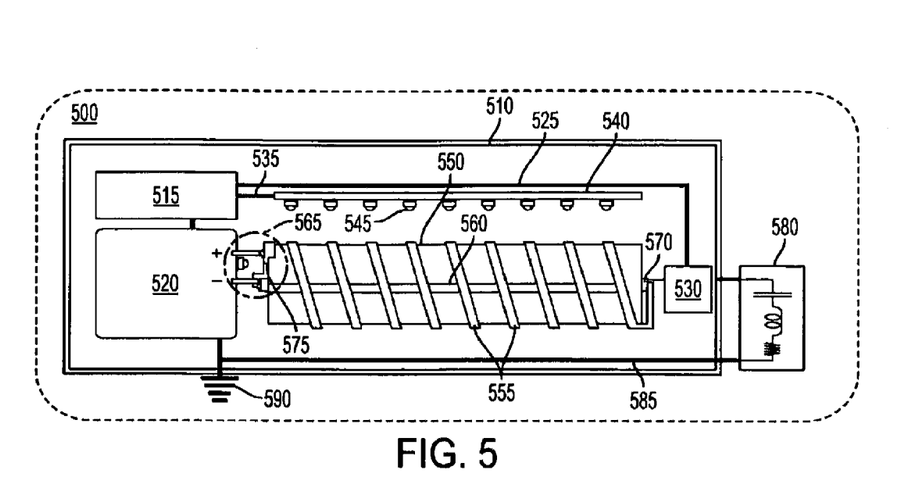
FIG. 5 is a cross-sectional view of a high inductance embodiment of a superconducting FCG.

FIG. 5 shows a notional schematic view of a first exemplary high inductance FCG 500 that uses the HTSCM. An environmentally sealed case 510 encapsulates the components. These include a device 515 for controlling and sensing connected to an energy source 520. A first conductor 525 connects the device 515 to a load switch 530. A second conductor 535 connects the device 515 to a plate 540 on which transition devices 545, such as laser diodes, are disposed in series. A cylindrical dielectric core 550 is disposed coaxially along the length of the case 510. A helical HTSCM coil 555 wraps around the dielectric core 550. The coil 555 represents a hybrid structure with a ceramic HTSCM of layered cuprates disposed on a metal base or substrate. Nickel represents the preferred substrate metal, due to its desirable properties of granularity, tensile strength and electrical conductivity.

A conductive shorting spline 560 runs collinearly along the length of the core 550 flanked by a superconductive switch 565 and the load switch 530. The spline 560 extends parallel to an HTSCM conductor 570 that is disposed inside and coaxial to the core 550. End terminals connect the HTSCM coil 555 and the HTSCM conductor 570 to form a HTSCM circuit in clockwise direction. The superconductive switch 565 connects the energy source 520 to the coil 555, and includes the split base 575 along with a transition device 545. The conductor 570 connects the coil 555 to the load switch 530. A reactive load 580 connects the load switch 530 to the energy source 520 via a third conductor 585 as well as to ground 590. The load 580 represents a capacitor-inductor-resistor circuit and is disposed outside the case 510.

Figure 6:
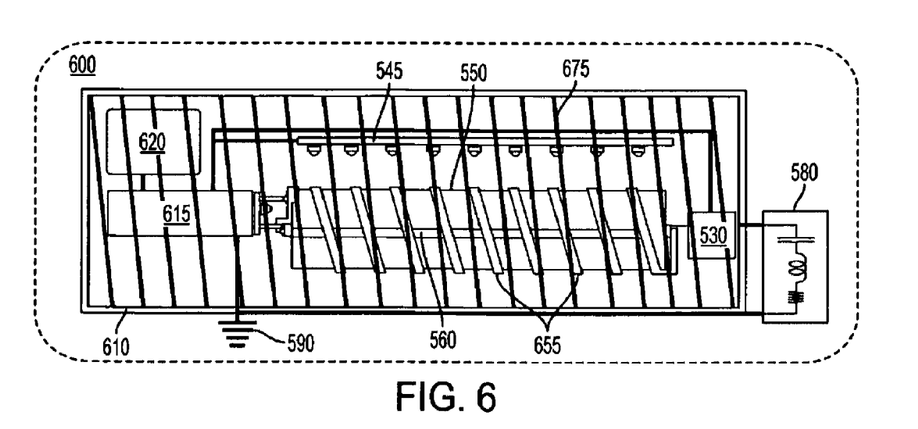
FIG. 6 is a cross-sectional view of a helical low inductance embodiment of a superconducting FCG.

FIG. 6 shows a notional schematic view of a second exemplary low inductance FCG 600 that uses the HTSCM. An environmentally sealed case 610 encapsulates the components. These include a device 615 for controlling and sensing connected to an energy source 620, to a load switch 530, and to a plate on which transition devices 545 disposed in series. A low inductance HTSCM helical stator coil 655 wraps around the dielectric core 550, in combination with the conductor 570. A conductive shorting spine 560 runs along the axial length of the core 550, which connects to the device 615. A higher relative inductance primary loader coil 675 surrounds the components and is coaxial to the secondary coil 655. A reactive load 580 disposed outside the case 610 connects the load switch 530 to the device 615 and to ground 590. Connectors and auxiliary components operate similarly to the first high inductance FCG 500.

The primary loader coil 675 has technical precedence in the technical literature, albeit sans HTSCM. See C. M. Fowler, R. S. Caird and W. B. Garn in "An Introduction to Explosive Magnetic Flux Compression Generators", LA-5890-MS, Los Alamos Scientific Laboratory, March 1975, available at http://www.ecoversity.org/archives/Magnetic_Flux_Compression_Generators.pdf, especially at pp. 11-14 (§§II.C.1, II.C.I.b(1) and (2)).

Figure 7:
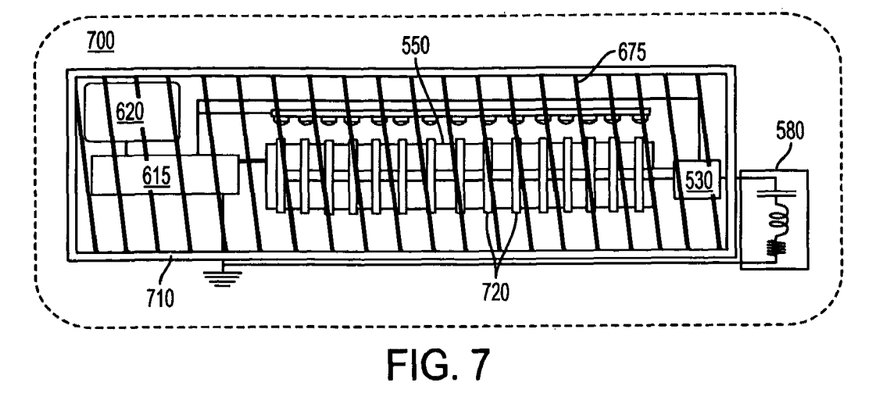
FIG. 7 is a cross-sectional view of a ring low inductance embodiment of a superconducting FCG.

FIG. 7 shows a notional schematic view of a third exemplary FCG 700 that uses the HTSCM. The environmentally sealed case 710 encapsulates the components and envelopes the loader coil 675. As with the second FCG 600 in FIG. 6, these include the device 615 for controlling and sensing connected to an energy source 620, as well as the load switch 630 that connects the device 615 to the load 680. An HTSCM ring stack 720 envelopes the core 550 as a low inductance ring stator. Each ring in the stack 720 comprises HTSCM disposed on a metal substrate. The conductive shorting spine 660 runs along the axial length of the core 650. The reactive load 580 connects the load switch 530 to the device 615 (as well as to ground 590).

Figure 8:
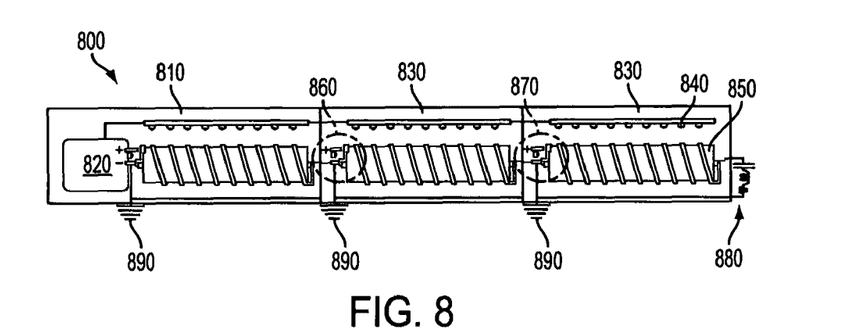
FIG. 8 is a cross-sectional view of a concatenated series of high inductance FCG devices.

FIG. 8 shows a notional schematic view of a modular stack 800 of three of the high inductance FCG devices 500 connected in series. A first such FCG 810 includes an energy source 820 and connects to a second FCG 820, which connects to a third FCG 830. The FCGs 810, 820 and 830 each include transition diodes 840 in series, the dielectric core 850, wrapped by the HTSCM coil 855. Each core 850 is flanked on opposite ends by a superconductive switch 860 and by a connecting switch 870. The third FCG 830 connects to a reactive load 880 that connects to ground 890 and to the switches 860.

Figure 9:
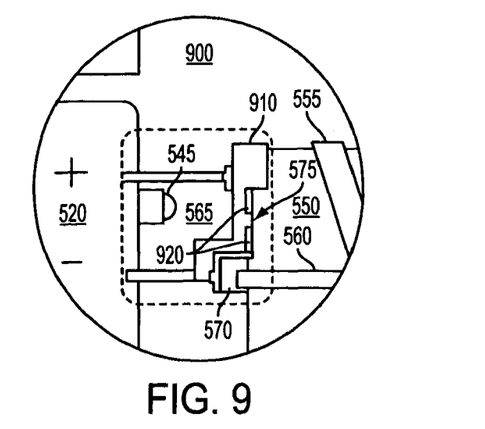
FIG. 9 is a detail view of the superconductive switch.

FIG. 9 shows a detail view 900 of the superconductive switch 565 within the high inductance FCG 500. In particular, the detail shows the geometry of the coil 555 at the terminal opposite the energy source 520. The coil 555 comprises an HTSCM layer 910 disposed on a nickel substrate 920. A gap between portions of the nickel substrate 920 forms the split base 575. The coil's terminal, including the split base 575, together with the transition device 545 produces the superconductive switch 565. Preferably the transition initiation device 545 can be a small, solid-state laser in close proximity to the HTSCM layer 910. Alternatively, an ohmic contact or traveling plasma wave can be used to initiate transition from superconducting to non-superconducting states.

Transitioning from high-temperature superconducting to non-superconducting state generally involves rises of only tens of degrees Celsius. At that stage, electrical conduction transitions from superconductivity in the HTSCM layer 910 to the metallic conductivity in the nickel substrate 920. Depending on the selected materials, with their mechanical characteristics and the level of superconductivity achieved, the coil 555 can have very close spacing leading to higher inductance designs.

Exemplary parameters for these components would provide for matched impedances through the pulse forming network between the FCG and the load circuit. This task is greatly simplified by the mechanism used by the HTSCM FCG and the ideal system equations provided earlier can be applied.

Similarly, the low inductance FCG 600 includes a stator coil 655 and a loader coil 675 having a higher relative inductance to provide for efficient flux energy transfer. Also, the low impedance FCG 700 includes a stator ring stack 720 rather than a helical coil. Though non-traditional, this stator inductance can be calculated using the previous equations in the same way as the helical stator due to the unique properties of the HTSC materials.

The environmentally sealed case 510, 610, 710 ensures a stable controlled environment for the device components to enable a highly controlled and predictive state reaction. The case contains the HTSCM coil 555, 655 or HTSCM ring stack 720 along with any component necessary to achieve a controlled transition of the HTSCM between non-superconducting states and superconducting states.

An HTSCM winding 555, 665 or HTSCM ring stack 720 acts as an electromagnetic stator for the FCG 500, 600 and 700. In a superconducting state, the HTSCM windings or rings can be energized with a current at near zero voltage differences between the windings. This enables the windings to be disposed arbitrarily close together with no resulting electric field breakdown while in the superconducting state. This also enables maximum energy to be stored in the resulting direct current magnetic field for the case of the helical winding implementation. An HTSCM return path (e.g., conductor 570), and/or connection to ground 590 may be employed to complete the circuit.

The energizing system, using the energy source 520, 620 (coupled to the control device 515, 615), supplies the HTSCM stator 555, 655 and 720 with a source current for ultimate generation of an EMP. The physical characteristics and performance parameters of energy source 520, 620 depend on the design of the stator 555, 655 and 720. In addition, performance can depend on relative inductance between the energy source 620 and a comparatively low inductance HTSCM stator as the coil 655 with the conductor 570, or else the ring stack 720.

The loader coil 675 collinear to the dielectric core 660 can be used to induce an electric current onto the coil 655 much as a transformer induces energy between collinear windings. This loader coil 675 may also be composed of an HTSCM overlaid on a metal substrate and can be contained within the sealed case 610. The loader coil 675 is deactivated as an open circuit to prevent transfer of flux energy from the stator coil 655 to the loader coil 675 during transition of the stator 655 from a superconducting state to a non-superconducting state. The high inductance FCG 500 has high coil inductance relative to the energy source 520. The source current can be provided by the energy source 520 through direct injection onto the stator as a high inductance coil 555 with the conductor 570. Fowler et al. (1975) provides a generalized loader coil topology for conventional E-FCG designs.

The transition devices 545 controllably alter the state of the FCG and behave effectively as switches by changing the HTSCM from superconducting state to non-superconducting state. The load switch 530 opens or closes a path to the reactive load 580. Other transition devices would be used to affect the stator and ensure portions are either in a superconducting state or a non-superconducting state. Through a controlled action of the transition devices 545, a high voltage pulse can be generated by the FCG 500. A variety of mechanisms influence the superconducting state of the stator that includes thermal, magnetic or ablative processes, and the transition devices 545 can be designed to provide the appropriate effect.

The three exemplary implementations of the FCG using HTSCM are described in association with FIGS. 5 through 7. The FCG 500 represents a high inductance implementation, whereas the FCGs 600 and 700 are low inductance implementations. These possible implementations are not exhaustive but provide the minimum design criteria for further extrapolation.

There are eleven primary components necessary for the high inductance implementation as the FCG 500. The environmental enclosure 510 provides for a closed boundary space where the environmental factors such as temperature pressure and gas content can be established and maintained. The energy source 520 provides electrical power to all electrical and electronic mechanisms to establish the state of the high inductance FCG 500. The energy source 520 injects current into the helical winding of the coil 555. The controller device 515 monitors the condition (or state) of the FCG 500 during operation and controls all processes that affect the FCG's state.

These processes include establishing the proper physical environment, energizing and de-energizing the system through the series of switches, such as the superconductive switch 565 and the load switch 530, as well as the other state transition devices 545, such as the laser diode depicted. The superconductive switch 565 may be incorporated to load the helical coil 555 for the high inductance version of the FCG 500. This is not a necessary component in the low inductance implementation for the FCG 600, 700.

The superconductive switch 565 takes advantage of the properties of the HTSCM in relation to the substrate base metal of the core 550 that can preferably be a nickel alloy. The HTSCM layer 910 forms a continuous path for the helical windings of the coil 555. The spline 560 represents a base metal for electrical conductivity to provide an angular dielectric discontinuity that extends axially along the core 550, thereby providing a high impedance axial path when the FCG's internal environment enables superconductivity of the HTSCM.

The split base 575, in the nickel layer 920 of the HTSCM coil 555, provides an electrical discontinuity to the coil 555. This discontinuity occurs in response to the HTSCM layer 910 transitioning to the non-superconducting state. While the HTSCM stator remains in the superconducting state, the current path is maintained through the HTSCM layer 910 of the coil 555. Irradiating (or illuminating) the portion of the HTSCM layer 910 at the split base 575 by the transition devices 545 drives the superconductive switch 565 above the superconductivity threshold temperature (thereby significantly raising electrical resistance very suddenly) to open the coil's circuit current path at the split base 575 where the gap in the nickel layer 920 is located.

This transition establishes a circuit path for current to be injected into the coil 555 from the energy source 520 in the non-superconducting state. Terminating the irradiation of the transition devices 545 reestablishes the superconductive property of the HTSCM layer 910 and closes circuit current path again for the helical winding of the coil 555. In this manner, the coil 555 and the core 550 remain intact for repeated use, in contrast to physical destruction after singular activation in conventional FCG designs.

Many options are available for transition devices 545 that can destabilize the superconducting state of an HTSCM such as by high magnetic fields, temperature and ablation or physical destruction of the HTSCM. The transition devices 545 depict notational representations of diode lasers. These devices 545 transition the state of the HTSCM by applying heat via thermal radiation. Upon heating a portion of the HTSCM beyond the threshold temperature, the transition propagates along the axial length of the helical winding in a cascade transition. Multiple transition devices 545 disposed along the coil 555 can accelerate the process, leading to higher transition rates and therefore higher output voltages with the adjustment frequency content.

The dielectric core 550 forms a nonconductive base that supports the structure while not significantly affecting the magnetic flux density generated by the FCG. An appropriate dielectric material also ensures against saturation of the device that limits the maximum energy values obtained by the system. The HTSCM helical coil 555, 655 represents the electrically inductive structure used to develop the magnetic flux fields. The helical coil 555, 655 comprises an HTSCM ribbon (as a layer 910 overlaid on a metal substrate 920) that wraps around the dielectric core 550. A superconducting closed current path (as the stator) forms between the helical coil 555, 655 and the HTSCM core conductor 570 when in the superconducting state.

The HTSCM core conductor 570 represents a co-axial wire disposed in the center of the helical winding within the dielectric core 550. This conductor 570 connects the two ends of the helical windings to form a closed continuous HTSCM circuit path for electrical current during the operation of the FCG in the superconducting state. By contrast, the substrate base metal of the core 550 carries the current while the HTSCM circuit has transitioned in a non-superconducting state.

The conductive shorting spline 560 is an electrically conductive material disposed between windings of the HTSCM helical coil 555, 655 to produce a continuous low impedance path for the current as the coil 555, 655 transitions to the non-superconducting state. This spline 560 can comprise any conductive material having high relative impedance while the HTSCM operates in the superconducting state, and low relative impedance while the HTSCM remains in a non-superconducting state. The conductive spline 560 functions to enable a continuous circulation of current during the reduction of the number of superconductive windings in the coil 555, 655, thereby compressing the magnetic flux.

The load switch 530 constitutes a transition mechanism that facilitates the transfer of energy from the helical winding to an appropriate load during the final state of operation when compression of the flux reaches maximum so that the potential energy also reaches maximum. The load switch 530, which is normally open, closes to connect the inductive elements of the FCG to the reactive load 580 designed to deliver a high voltage pulse. This can be a pulse forming network, an antenna or another FCG.

FCG design considerations include the option of low inductance helical winding for the coil 655. Eleven primary components constitute preferable criteria for the low inductance FCG 600. The environmental enclosure 610 remains similar to the enclosure 510 for the high inductance FCG 500. The energy source 620 for a low inductance FCG 600 provides power to all electrical and electronic mechanisms to establish (or transition) the state of the FCG. For the low inductance FCG 600, the energy source 620 may also energize the loader coil 675 (effectively a primary winding) of the FCG 600 depending on the configuration of the transformer topology.

The low inductance FCG 600 can be more efficiently energized through the utilization of a transformer topology whereby the loader coil 675 is placed either collinearly with the HTSCM coil 655 (auto transformer topology) or in parallel (standard cage transformer topology). FIGS. 6 and 7 both depict an auto transformer arrangement. To incorporate a parallel configuration, an external power source may be preferred for simplicity in the final design.

The controller and sensor device 615 for the low inductance FCG 600 is similar to its counterpart device 515 for the high inductance FCG 500. The low inductance FCG 600, 700 may also use the same transition devices 545 as for the high inductance FCG 500, except that the superconductive switch 565 can optionally be omitted from the design. The HTSCM helical coil 655 for the low inductance FCG 600 is similar to its counterpart coil 555 for the high inductance FCG 500. The low inductance FCG 600 may also employ the same dielectric core 550, HTSCM core conductor 570, conductive shorting spline 560, load switch 530, and the reactive load 580 as for the high inductance FCG 500.

For designing the low inductance stacked ring FCG 700 there are ten primary components. The environmental enclosure 710 remains similar to the counterpart enclosure 610 for the low inductance FCG 600. The energy source 620 for a low inductance FCG 700 provides power to all electrical and electronic mechanisms to establish the state of the HTSCM, and may also energize the loader coil 675 depending on the configuration of the transformer topology. The low inductance FCG 700 may also use the same dielectric core 550, conductive shorting spline 560, load switch 530, and reactive load 580 as for the high inductance FCG 500.

The HTSCM ring stack 720 represents a unique design implementation made possible through the use of HTSCM while in the superconducting state. Each of the ring elements remains electrically isolated from its neighboring elements. These rings in the stack 720 can be excited through inductive processes by using transformer topology. The stack 720 exhibits energy latency while in the superconducting state. Once induced, current continues to circulate around the rings until they transition into the non-superconducting state.

For this low inductance FCG topology, the core conductor 570 unnecessary (and thus merely optional) into the design because each ring of the stack 720 creates the closed path while in a superconducting state. Conservation of flux ensures energy transfer from ring element to ring element in the stack 720 during transition. The conductive shorting spline 560 forms a low impedance path from the last active elements to the reactive load 580 during final stages of superconductive to non-superconducting state transition.

Operation of the high inductance FCG 500 can be described by the following steps: First, energize the FCG by the following: (a) establish the threshold environment; (b) activate the energy source 520; (c) activate the superconductive switch 565 (such as the transition device 545) to illuminate the HTSCM bridge represented by a terminal segment of the coil 555; (d) inject current into the HTSCM stator as the coil 555 plus the conductor 570 and the core 550; (e) upon reaching threshold condition, shift the current from the metal substrate 920 of the coil 555; (f) deactivate transition device 545 to reintroduce the HTSCM continuous path on the coil 555 as the HTSCM stator; (g) continue to circulate current until exceeding the superconductive threshold.

Step (c) can be accomplished by driving a short length of the coil 555 above the superconductive temperature threshold at the split base 575 that represents a feed lug. This produces a temporary electrical gap between that feed lug and ground 590. The feed lug designates a position for initiation of current of the coil 555 as the HTSCM stator.

Second, flux compression initiated through sequential activation of transition devices: (h) initiate the transition device 545 at a feed lug of the coil 555 as the stator; (i) initiate transition device 545 in sequence from a feed lug (e.g., junction connector) of the reactive load 580; (j) compress magnetic flux as current engages an alternative path onto the electrically short spline 560; and (I) activate the load switch 530. In step (h), activation of the transition device 545 causes the HTSCM to exceed the threshold temperature and enter a state of low conductivity (i.e., high resistance relative to the base metal strip). Step (j) reduces stator length (i.e., conduction path of the coil 555) and thereby reduces inductance of the HTSCM stator, which can be represented as the coil 555 plus the conductor 570 and the core 550. Step (I) releases energy into the load 580, which can be an inductive load such as an antenna, a specialized pulse forming network, or another FCG placed in series. This energy release induces the EMP.

Operation of the low inductance FCG 600 can be described by the following steps: First, the FCG 600 is energized by the following: (a) establish the threshold environment; (b) directly load the current to the HTSCM stator as the coil 655 plus the conductor 570 and the core 550 by induction between the loader coil 675 and the secondary coil 655; (c) couple current directly onto the coil 655 as the HTSCM stator upon reaching the threshold condition; and (d) continue to circulate current until exceeding the superconductive temperature threshold that deactivates the loader coil 675. Step (b) can also be accomplished by E-FCG configurations. The HTSCM stator can be represented as the coil 655 plus the core 550.

Second, flux compression is initiated through sequential activation of transition devices: (e) initiate transition device at a feed lug of the stator; (f) initiate the transition device 545 in sequence from a feed lug (e.g., junction connector) of the reactive load 580; (g) compress magnetic flux as current engages an alternative path onto the electrically short spline 560, thereby reducing inductance of the coil 655; and (h) activate the load switch 530. In step (f), activation of the transition device 545 causes the HTSCM to exceed the threshold temperature and achieve a state of low conductivity (i.e., high resistance relative to the base metal strip). Step (h) releases energy into the reactive load 580, which can be an inductive load such as an antenna, a specialized pulse forming network, or another FCG placed in series. This energy release induces the EMP.

Operation of the low inductance FCG 700 can be described by the following steps: First, the FCG 700 is energized by the following: (a) establish the threshold environment; (b) directly load the current to the ring stack 720 as the HTSCM stator by induction between the loader coil 675 and the ring stack 720; (c) couple current directly onto the ring stack 720 upon reaching the threshold condition; and (d) continue to circulate current until exceeding the superconductive threshold for each ring element of the stack 720. Deactivate and disable the loader coil 675. The HTSCM stator can be represented as the stack 720 plus the core 550. In step (b), current couples directly onto the stack 720 in the superconducting condition, but otherwise current couples to the substrate base metal of the core 550.

Second, flux compression initiated through sequential activation of transition devices: (e) initiate transition device at a feed lug of the stator; (f) initiate the transition device 545 in sequence from a feed lug (e.g., junction connector) of the reactive load 580; (g) compress magnetic flux as current engages an alternative path onto the electrically short spline 560, thereby reducing inductance of the stack 720; and (h) activate the load switch 530 to release energy to the reactive load 580. In step (g), activating the transition devices 545 for any HTSCM element of the stack 720 causes the HTSCM to exceed its threshold temperature and enter a state of low conductivity (high resistance) relative to the base metal strip. The energy release in step (h) induces the EMP.

Conservation of magnetic flux ensures that energy couples onto the ring elements in the stack 720 that remain in the superconducting state. The transition devices 545 can be initiated in a preferred sequence. Magnetic flux compression occurs as conservation of flux translates more current into the final remaining elements in the stack 720 that still maintain their superconducting state. Activation of the load switch 530 in step (h) releases energy via the conductive spline 560 and switches into an inductive load such as an antenna, a specialized pulse forming network or another FCG placed in series.

Advantages of these exemplary embodiments include simplicity. Because of the physical characteristics and behavior of HTSCMs, additional techniques to design a highly effective stator are available that would be impractical for a conventional E-FCG. An example of this is the stacked ring topology for the stator for the FCG 700. The HTSCM enables the stacked ring topology to be utilized because of the current latency available to a superconductive closed path.

Consequently, this simpler, safer and more reliable mechanism can be employed to energize the system, rather than explosive FCGs (E-FCGs) that typically rely on a Marx generator for energizing. Other advantages include: mitigation against hazards of electromagnetic radiation to ordnance (HERO) mitigation, scalability, modularity, frequency tunability, improved quality assurance. Marx generators are circuits designed to yield a high-voltage pulse and employed for simulating lighting discharges.

Elimination of HERO concerns for storage and maintenance can be accomplished, as exemplary FCG devices do not contain chemical explosives. Further information on HERO is available in NAVSEA OP 3565/NAVAIR 16-1-529 v. 2, 16/e, Technical Manual "Electromagnetic Radiation Hazards", 2007, ch. 2, available at http://www.everyspec.com/USN/NAVSEA_OP_3565-NAVAIR16-1-529_VOLUME-2.8137.pdf. Component stacking facilitates modular design. An E-FCG has only a limited range of effective frequencies and these tend to be very low. A properly designed FCG that incorporates HTSCM enables the magnetic flux to generate and collapse at rates governed by the electron pairing speed in pico-seconds (ps) being limited by threshold mechanism switching speed in nano-seconds (ns).

Improved quality assurance can be provided by exemplary embodiments due to their nondestructive operation. By contrast, an E-FCG cannot be thoroughly tested prior to employment, due to consumption of the solenoid and cylinder. A properly designed FCG using HTSCM can employ non-destructive test procedures to ensure all components are operational prior to employment through built-in-tests (bit). For a stacked ring topology, failure of a small portion of ring elements due to damage of manufacturing flaws does not significantly reduce operational effectiveness. Designs are feasible with contemporary and developing HTSCM technologies: System capability is limited only by the available HTSCM technology. However, because this represents a very active field for scientific research, future developments are expected to significantly enhance design capabilities.

The FCG produces the pulse via the pulse forming network. The reactive load 580 directs that pulse; whether to the environment or to another FCG. The energy source can be a small battery for milliamp devices, or else a capacitively loaded current generator 520, 620. The current pulse can be delivered to the reactive load 580 via at least one of several conduits: primarily the conductive spline 560 for a primary portion of the path, the HTSCM coil 555 or center conductor 570, and the nickel of the HTSCM ribbon 675, but not through the dielectric material in the core 550. The nickel conducts during the current loading by its interconnecting portions overlaid on the spline 560 in the non-superconducting state.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. A flux compression generator (FCG) for producing an electromagnetic pulse (EMP), said FCG comprising:
   an environmental case;
   a reactive load that transmits the EMP in response to an electric current pulse;
   a dielectric core having proximal and distal ends within said case;
   a superconducting electromagnetic stator distributed coaxially around said core, said stator being disposed within said case;
   an electrical energy source within said case, said energy source connecting to said stator at said proximal end;
   a load switch that connects said reactive load to said stator at said distal end; and
   at least one transition device powered by said energy source and within said case, wherein
   said core structurally supports said stator;
   said energy source initially provides an electric current to said electromagnetic stator,
   said device upon activation heats at least a portion of said stator to reversibly transition said portion from a superconducting state to a non-superconducting state, and
   said stator transferring said electric current as said pulse to said reactive load in response to said portion transitioning to the non-superconducting state.

2. The FCG according to claim 1, wherein said stator comprises a superconducting coil helically wound around said core and a superconducting conductor disposed coaxially through said core.

3. The FCG according to claim 2, wherein said coil and said conductor comprise a high temperature superconductive material (HTSCM) disposed on a metal substrate.

4. The FCG according to claim 3, wherein said metal substrate comprises nickel.

5. The FCG according to claim 2, wherein said core further includes a spline that provides an electrically short path for said electric current passing along said core in response to said coil being in a non-superconducting state.

6. The FCG according to claim 1, wherein said stator comprises a stack of superconducting rings distributed coaxially around said core, and said core further includes a spline for conducting said electric current to said load switch upon said portion transitioning to the non-superconducting state.

7. The FCG according to claim 6, wherein each of said rings comprises an HTSCM disposed on a metal substrate.

8. The FCG according to claim 1, further comprising a controller for activating said transition device by said energy source.

9. The FCG according to claim 1, further comprising:
   a superconductive switch that connects said energy source to said device for controllably heating said portion of said stator.

10. The FCG according to claim 1, further comprising:
    a loading coil within said case to receive said electric current from said energy source and induct said electric current to said stator.

11. The FCG according to claim 10, wherein said loading coil comprises an HTSCM disposed on a metal substrate.

12. A flux compression generator (FCG) for producing an electromagnetic pulse (EMP), said FCG comprising:
    an environmental case;
    a reactive load that transmits the EMP in response to an electric current pulse;
    a dielectric core having proximal and distal ends within said case;
    a superconducting coil that helically winds coaxially around said core, said coil being within said case;
    a superconducting conductor coaxial to and within said core, said conductor connecting to said coil at both said ends to form an electromagnetic stator;
    an electrical energy source within said case, said energy source connecting to said coil at said proximal end;
    a load switch that connects said reactive load to said stator at said distal end; and
    at least one transition device powered by said energy source and within said case, wherein
    said core structurally supports said coil;
    said energy source initially provides an electric current to said electromagnetic stator,
    said device upon activation heats at least a portion of said coil to reversibly transition said portion from a superconducting state to a non-superconducting state, and said coil transferring said electric current as said pulse to said reactive load in response to said portion transitioning to the non-superconducting state.

13. The FCG according to claim 12, wherein said coil and said conductor comprise an HTSCM disposed on a metal substrate.

14. The FCG according to claim 13, wherein said metal substrate comprises nickel.

15. The FCG according to claim 12, further comprising a controller for activating said transition device by said energy source.

16. The FCG according to claim 12, wherein said core further includes a spline that provides an electrically short path for said electric current passing along said core in response to said coil being in a non-superconducting state.

17. The FCG according to claim 12, further comprising:
a superconductive switch that connects said energy source to said device for controllably heating said portion of said coil.

18. The FCG according to claim 12, further comprising:
a loading coil within said case to receive said electric current from said energy source and induct said electric current to said superconducting coil.

19. The FCG according to claim 18, wherein said loading coil comprise an HTSCM disposed on a metal substrate.

20. A flux compression generator (FCG) for producing an electromagnetic pulse (EMP), said FCG comprising:
an environmental case;
a reactive load that transmits the EMP in response to an electric current pulse;
a dielectric core having proximal and distal ends within said case, said core having an electrically conductive spline that extends between said ends;
a stack of superconducting rings disposed coaxially along said core, said stack being within said case;
an electrical energy source within said case, said energy source connecting to said spline at said proximal end;
a load switch that connects said reactive load to said spline at said distal end; and
at least one transition device powered by said energy source and within said case, wherein
said core structurally supports said stack;
said energy source initially provides an electric current to said electromagnetic stator,
said device upon activation heats at least a ring of said stack to reversibly transition said ring from a superconducting state to a non-superconducting state, and
said stack transferring said electric current as said pulse to said reactive load in response to said ring transitioning to the non-superconducting state.

21. The FCG according to claim 20, wherein said rings comprise an HTSCM disposed on a metal substrate.

22. The FCG according to claim 20, wherein said core further includes a spline that provides an electrically short path for said electric current passing along said core in response to said coil being in a non-superconducting state.

23. The FCG according to claim 20, further comprising:
a loading coil within said case to receive said electric current from said energy source and induct said electric current to said stack.

24. The FCG according to claim 23, wherein said loading coil comprise an HTSCM disposed on a metal substrate.

* * * * *